United States Patent
Goldman et al.

(10) Patent No.: US 6,426,667 B1
(45) Date of Patent: Jul. 30, 2002

(54) BIDIRECTIONAL ANALOG SWITCH USING TWO BIPOLAR JUNCTION TRANSISTORS WHICH ARE BOTH REVERSE CONNECTED OR OPERATING IN THE REVERSE OR INVERSE MODE

(75) Inventors: Richard Goldman; David Miles, both of Gloucestershire (GB)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/455,398

(22) Filed: Dec. 6, 1999

(30) Foreign Application Priority Data

Dec. 7, 1998 (GB) ............................................. 9826877

(51) Int. Cl.$^7$ ............................................. H03K 17/60
(52) U.S. Cl. ........................ 327/478; 327/405; 327/419; 327/482; 257/524; 257/525; 257/526
(58) Field of Search ................................. 327/405, 419, 327/478, 482; 257/524, 525, 526

(56) References Cited

U.S. PATENT DOCUMENTS

| | | | |
|---|---|---|---|
| 3,733,441 A | * | 5/1973 | McCorkle et al. |
| 4,201,957 A | * | 5/1980 | Cathell |
| 4,232,328 A | | 11/1980 | Hartman et al. |
| 4,255,782 A | * | 3/1981 | Joyce |
| 4,367,419 A | * | 1/1983 | Yazawa et al. ............. 307/254 |
| 4,520,382 A | | 5/1985 | Shimura |
| 4,572,967 A | * | 2/1986 | Metz ........................ 307/243 |
| 4,608,590 A | | 8/1986 | Hartman et al. |
| 5,241,211 A | | 8/1993 | Tashiro |

FOREIGN PATENT DOCUMENTS

| | | |
|---|---|---|
| EP | 0465961 | 1/1992 |
| EP | 0530497 | 3/1993 |
| EP | 0615287 | 9/1994 |
| EP | 0646956 | 4/1995 |
| EP | 0807969 | 11/1997 |
| FR | 2490405 | 3/1982 |
| GB | 2289162 | 11/1995 |
| GB | 2290165 | 12/1995 |
| JP | 2180899 | 7/1990 |
| JP | 2246137 | 10/1990 |
| JP | 2268463 | 11/1990 |
| JP | 03290948 | 12/1991 |
| JP | 6267966 | 9/1994 |
| JP | 7115124 | 5/1995 |
| WO | WO9306622 | 4/1993 |
| WO | WO9313554 | 7/1993 |

OTHER PUBLICATIONS

International Search Report Application No. GB9826877.4.
International Search Report Application No. PCT/EP99/09268.
Novelty Search Report, pp. 1–2.
European Patents Abstracts—p. 65 EP(A)–N.
European Patents Abstracts—p. 119 EP(A)–N.

* cited by examiner

Primary Examiner—Nathan J. Flynn
Assistant Examiner—Kevin Quinto
(74) Attorney, Agent, or Firm—Burns, Doane, Swecker & Mathis, L.L.P.

(57) ABSTRACT

The present invention relates to an integrated circuit bidirectional switch formed from bipolar transistor devices, in which the saturation voltage is sought to be reduced. More specifically, an integrated NPN bipolar transistor is formed with oxide insulation, and the normal direction of current flow is from the emitter to collector, and an integrated PNP bipolar transistor is formed with oxide insulation, and the normal direction of current flow is from the collector to emitter.

6 Claims, 3 Drawing Sheets

BIDIRECTIONAL ANALOG SWITCH USING TWO BIPOLAR JUNCTION TRANSISTORS WHICH ARE BOTH REVERSE CONNECTED OR OPERATING IN THE REVERSE OR INVERSE MODE

TECHNICAL FIELD OF THE INVENTION

This invention relates to an analogue switch, and more specifically to an analogue switch including at least one bipolar transistor, in an integrated circuit. The invention also relates to an integrated circuit including such a transistor.

BACKGROUND OF THE INVENTION

EP-0615287 describes an integrated bipolar transistor. As is conventional, this device is made up of regions of semiconductor material, in which conduction takes place by the movement of particles of negative (N) and positive (P) conductivity types. In the case of an NPN bipolar transistor, a collector tub (or well) of N-type material is formed. Formed within the collector tub is a collector connection region of more heavily doped ($N^+$) N-type material, as well as a base region of P-type material. An emitter region of $N^+$ type material is formed within the base region.

In order to provide electrical isolation between this device and other devices in the integrated circuit, this whole device is surrounded by a layer of insulated material such as silicon dioxide. However, a disadvantage of this structure is that, even when the device is switched on, there is a potentially significant minimum voltage drop from collector to emitter. This is known as the saturation voltage, and is normally of the order of 100–200 mV, which is very much higher than the corresponding voltage drop across a conducting CMOS device.

When a bipolar transistor is saturated, the switching speed of the transistor becomes relatively slow.

EP-0615287 therefore describes a device which attempts to allow faster recovery from saturation. Specifically, that document discloses locating, on the surface of the N-type collector well, a region of P-type semiconductor material, which is connected to a grounding electric potential.

SUMMARY OF THE INVENTION

The present invention relates to a device structure of the same general type of that described above, but in which the saturation voltage is sought to be reduced. More specifically, according to a first aspect the invention provides an integrated NPN bipolar transistor formed with oxide insulation, in which the normal direction of current flow is from the emitter to collector. According to a second aspect the invention provides an integrated PNP bipolar transistor formed with oxide insulation, in which the normal direction of current flow is from the collector to emitter.

In each case, these directions are the reverse of the normal directions of current flow.

DETAILED DESCRIPTION OF PREFERRED EMBODIMENTS

Figure 1:
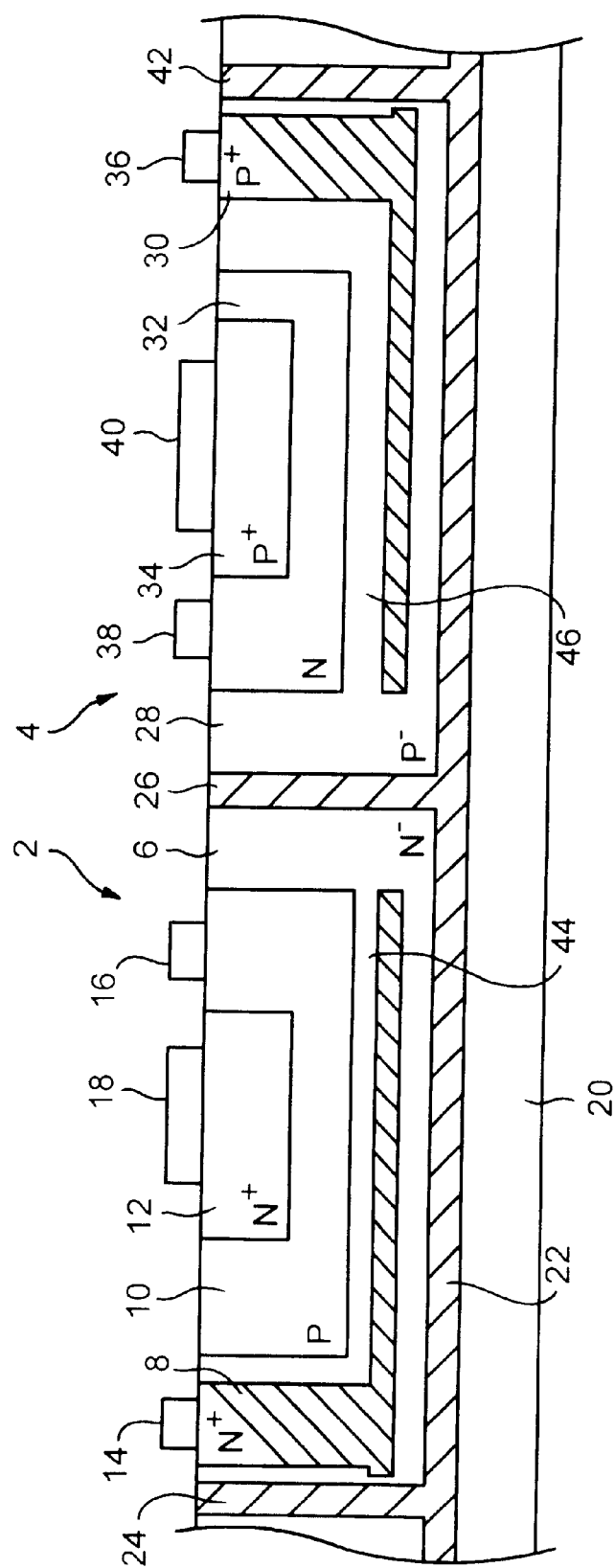
FIG. 1 is a schematic diagram of a transistor device in accordance with the invention.

FIG. 1 is a schematic sectional view of a part of an integrated circuit, including an NPN transistor 2 and a PNP transistor 4.

In the case of the NPN transistor 2, there is a collector well (or tub) of $N^-$ type semiconductor material 6, with a collector connection region of $N^+$ type material 8 formed therein. Also formed in the collector well is a base region 10 of P-type semiconductor material, which surrounds an emitter region 12 of $N^+$ type semiconductor material. A collector connection terminal 14, base terminal 16, and emitter terminal 18 are formed on the upper surfaces of the collector connection region 8, base region 10, and emitter region 12 respectively.

The NPN device 2 is formed on a substrate 20, but is completely electrically isolated therefrom by a layer of insulating silicon oxide 22, which is formed across the upper surface of the substrate 20. The NPN device 2 is further electrically isolated from other devices by means of oxide trenches 24, 26, which extend from the upper surface of the device down to the horizontal layer 22. These trenches surround the device such that the tub 6 has complete ohmic isolation from surrounding devices.

In the case of the PNP device 4, a collector well 28 is formed of $P^-$ type semiconducting material, and has a collector connection region 30 of $P^+$ type semiconductor material formed therein. Also formed within the collector well 28 is a base region 32 of N type semiconductor material, which surrounds an emitter region 34 of $P^+$ type semiconductor material. A collector connection terminal 36, a base terminal 38, and an emitter terminal 40 are formed respectively on the upper surfaces of the collector connection region 30, base region 32, and emitter region 34.

The PNP device 4 is completely electrically isolated from the substrate 20 by a layer of insulating silicon oxide 22, and further electrically isolated from other devices by means of oxide trenches 26, 42, which extend from the upper surface of the device down to the horizontal layer 22. These trenches surround the device such that the tub 28 has complete ohmic isolation from surrounding devices.

In accordance with the invention, these devices are reverse connected during operation of the integrated circuit. That is, in the case of the NPN transistor 2, the emitter 12 is at a higher voltage than the respective collector connection region 8. In the case of the PNP transistor 4, the collector connection region 30 is at a higher voltage than the emitter 34. This has the effect that the saturation voltage of the device is reduced, as will be described in more detail below.

However, it thereby becomes an essential feature of the device that it is an insulated device, with complete ohmic isolation of the collector tub from surrounding devices, rather than a more conventional junction isolated device, in which devices are isolated using PN junctions. The ohmic isolation may be provided by an oxide layer, or another suitable material. The reason for this requirement is that, when the collector tub is of the opposite conductivity type to the substrate, as is conventional, and as inevitably must sometimes be the case when devices having collector wells of both conductivity types are in use, a parasitic device can be formed. That is, in the case of a NPN transistor, formed of the general type as shown in FIG. 1, formed on a P type substrate, the collector well is of N type material, the base region is of P type material, and the emitter region is of N type material. However, if the emitter region is at a higher voltage than the collector connection region, a parasitic PNP transistor can be formed having the P type base region as its emitter, the N type collector well as its base region, and the P type substrate as its collector connection region. This parasitic PNP transistor will allow a large unwanted current to flow from the base of the NPN transistor into the substrate.

However, the use of the horizontal isolating layer 22, and the isolating trenches, means that, in the case of the device shown in FIG. 1, no such parasitic devices can be formed.

In order to be suitable for reverse connection in this way, the transistor must have a relatively high current gain, β, in the reverse direction. This can be achieved, as shown in FIG. 1, by forming the collector connection terminal 14, 30 with a buried layer beneath the base region 10, 32. The epitaxial layers 44, 46 between the buried layers and respective base regions should be as thin as possible to maximise β. However, an acceptably high value of current gain in the reverse direction, or "reverse β", may also be achieved without the buried layers if the epitaxial layer is thin enough.

Figure 2:
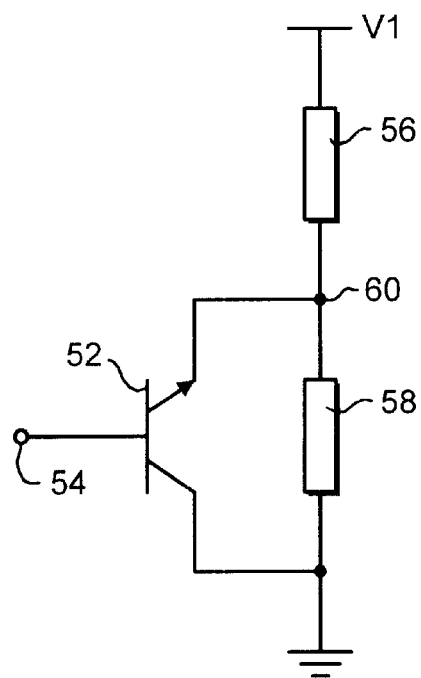
FIG. 2 is a circuit diagram showing the principle of operation of a device in accordance with the invention.

FIG. 2 is an illustration of the use of an NPN transistor in such a configuration. Specifically, the transistor 52 has its collector terminal connected to ground, and its base input 54 is held at a positive voltage with respect to the ground. A reference voltage V1 is connected across a first resistor 56 and a second resistor 58, and the emitter terminal of the transistor 52 is connected to a node 60 between the resistors 56, 58. Thus, the transistor 52 is reverse biased in the sense that, whereas the collector terminal of a transistor is normally held at a higher voltage than the emitter, in this case the emitter terminal is at a higher voltage level than the collector. However, whereas, with the transistor conventionally biased, the voltage drop from collector to emitter would typically be in the region of 100–200 mV, with the transistor switched on, this voltage is typically less than 30 mV with the transistor reverse biased as shown in FIG. 2.

Reverse connected devices, as shown in FIG. 1, therefore find application in switched voltage reference circuits, which may use an NPN transistor, or a PNP transistor, as required.

Figure 3:
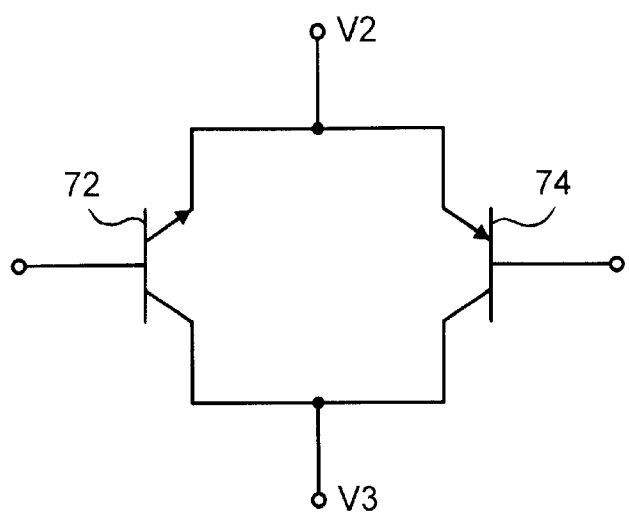
FIG. 3 shows an analogue switch in accordance with a second aspect of the invention.

FIG. 3 shows a bidirectional switch, using two devices of opposite polarity, for example an NPN and a PNP transistor as shown in FIG. 1. The circuit of FIG. 2 works only when the voltage V1 is always positive. However, FIG. 3 shows a circuit of a type which can be used when a signal is swinging positive and negative of a reference voltage. FIG. 3 shows a circuit having a NPN transistor 72 and PNP transistor 74, connected in parallel between an input terminal having a signal voltage V2 thereon and a reference terminal having a reference voltage V3 thereon. When V2 is higher than V3, current flows through the NPN device 72, whereas, when V3 is higher than V2, current flows through the PNP device 74.

Figure 4:
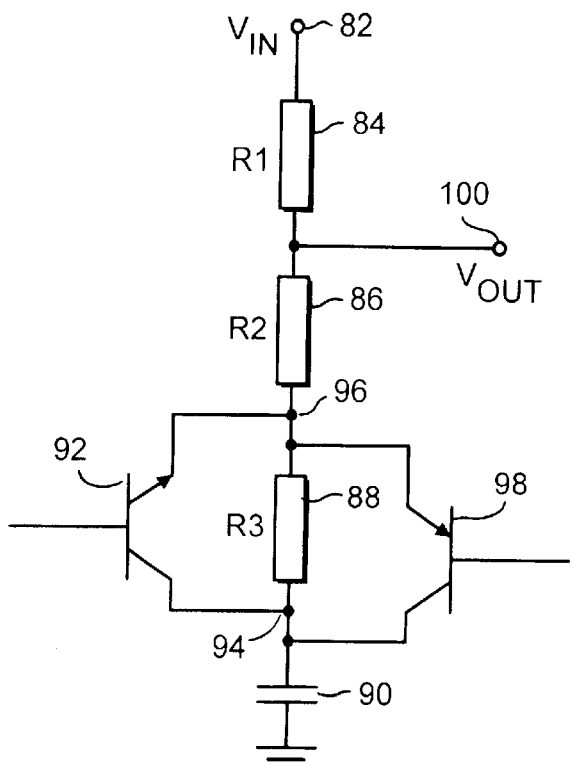
FIG. 4 shows a second analogue switch in accordance with the second aspect of the invention.

A more detailed diagram of a circuit applying this principle is shown in FIG. 4, in which an input voltage $V_{IN}$ is applied to an input terminal 82, which is connected across a first resistor 84, a second resistor 86, and a third resistor 88 to a reference voltage $V_{REF}$ 90.

An NPN transistor 92 is reversed connected across the resistor 88. That is, its collector terminal is connected to the node 94 between the resistor 88 and reference voltage source 90, while its emitter is connected to the node 96 between the resistors 86, 88. A PNP transistor 98 is also reverse connected across the resistor 88. That is, its emitter is connected to the node 96, and its collector is connected to the node 94.

An output signal $V_{OUT}$ is provided at an output node 100. With appropriate connections, the transistors 92, 98 can be as shown in FIG. 1. Thus, the terminals marked in FIG. 4 as the collectors of the transistors 92, 98 are the terminals located in the collector wells. However, because the transistors are reverse connected, the normal directions of current flow are reversed. That is, in the case of the NPN transistor 92, the direction of current flow is from emitter to collector, and, in the case of the PNP transistor 98, the direction of current flow is from the collector to emitter.

At low differential collector-emitter voltages, the resistances of the devices are much lower for currents flowing from emitter-collector than for collector-emitter, and so this is the preferred direction of current flow and hence the saturation voltage across the device is reduced.

The circuit of FIG. 4 makes use of the lower saturation voltage of a reverse connected transistor, in an arrangement which allows the input signal to go both positive and negative of the reference voltage.

Figure 5:
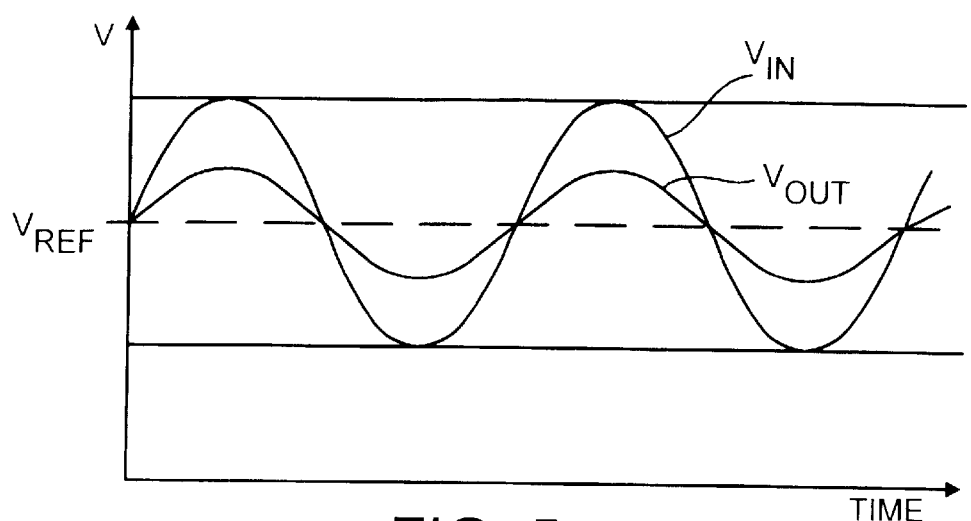
FIG. 5 is a time history of input and output signals of the circuit of FIG. 4.

Thus, as shown in FIG. 5, when $V_{IN}$ is positive of $V_{REF}$, current flows through the NPN transistor 92 from emitter to collector, and the output voltage $V_{OUT}$ at the output terminal 100 is given by:

$$V_{OUT} = V_{REF} + (V_{IN} - V_{REF}) \times \frac{R2}{(R1 + R2)} + V_{ec\_sat}$$

where R1 and R2 are the resistance values of resistors 84, 86 respectively, and $V_{ec\_sat}$ is the saturation voltage of the transistor 92 in the direction from emitter to collector.

Where the input voltage $V_{IN}$ is negative of $V_{REF}$, current flows in the reverse direction, that is from collector to emitter, in the PNP transistor 98, and, again, the output voltage $V_{OUT}$ is given by:

$$V_{OUT} = V_{REF} + (V_{IN} - V_{REF}) \times \frac{R2}{(R1 + R2)} - V_{ec\_sat}$$

where $V_{ec\_sat}$ is the saturation voltage of the transistor 98 in the direction from emitter to collector.

In this case, however, the second term on the right hand side of the equation will be negative, and $V_{OUT}$ will be negative of $V_{REF}$.

FIG. 5 shows the way in which $V_{OUT}$ follows $V_{IN}$, irrespective of whether it is positive or negative of $V_{REF}$.

When the switch is off, current flows also through the resistor 88, which has the resistance value R3, and the output voltage is then given by:

$$V_{OUT} = V_{REF} + (V_{IN} - V_{REF}) \times \frac{(R2 + R3)}{(R1 + R2 + R3)}$$

Since $V_{ec\_sat}$, the saturation voltage of the transistors in the direction from emitter to collector, is much smaller than the saturation voltage in the direction from collector to emitter, the output voltage is more accurate than in a switch which does not use reverse connected devices.

There are thus disclosed an integrated transistor which allows advantage to be taken of the lower saturation voltage when the device is reverse connected, and a switching device which allows this feature to be used to provide an output voltage which follows an input voltage which can swing either positive or negative of a reference voltage.

What is claimed is:

1. An integrated circuit bidirectional switch, comprising:
    a reverse connected electrically isolated NPN bipolar transistor;
    a reverse connected electrically isolated PNP bipolar transistor; and
    means for supplying an input control signal and a reference signal thereto.

2. An integrated circuit bidirectional switch, comprising:
    a reverse connected electrically isolated NPN bipolar transistor;
    a reverse connected electrically isolated PNP bipolar transistor;
    means for supplying an input control signal and a reference signal thereto; and
    first, second and third resistors, connected in series with a first terminal of the first resistor connected to an input terminal, a second terminal of the first resistor connected to an output terminal, a first terminal of the third resistor connected to a reference voltage, and the NPN transistor and PNP transistor connected across the third resistor.

3. A switch as claimed in claim 1, wherein the NPN bipolar transistor comprises:
    a first collector region located in a first collector well;
    a first base region;
    a first emitter region; and
    a first layer of electrically insulating material, located around the first collector well to achieve complete ohmic isolation thereof from surrounding devices,
    the first collector region and first emitter region being connected such that current in the NPN transistor flows primarily from emitter to collector.

4. A switch as claimed in claim 1, wherein the PNP bipolar transistor comprises:
    a second collector region located in a second collector well;
    a second base region;
    a second emitter region; and
    a second layer of electrically insulating material, located around the second collector well to achieve complete ohmic isolation thereof from surrounding devices,
    the second collector region and second emitter region being connected such that current in the PNP transistor flows primarily from collector to emitter.

5. A switch as claimed in claim 2, wherein the NPN bipolar transistor comprises:
    a first collector region located in a first collector well;
    a first base region;
    a first emitter region; and
    a first layer of electrically insulating material, located around the first collector well to achieve complete ohmic isolation thereof from surrounding devices,
    the first collector region and first emitter region being connected such that current in the NPN transistor flows primarily from emitter to collector.

6. A switch as claimed in claim 2, wherein the PNP bipolar transistor comprises:
    a second collector region located in a second collector well;
    a second base region;
    a second emitter region; and
    a second layer of electrically insulating material, located around the second collector well to achieve complete ohmic isolation thereof from surrounding devices,
    the second collector region and second emitter region being connected such that current in the PNP transistor flows primarily from collector to emitter.

* * * * *